United States Patent
Koch et al.

(10) Patent No.: US 8,212,519 B2
(45) Date of Patent: Jul. 3, 2012

(54) METHOD AND SYSTEM FOR DETERMINING A STATE OF CHARGE OF A BATTERY

(75) Inventors: Brian J. Koch, Berkley, MI (US); Robert S. Conell, Sterling Heights, MI (US); Mark W. Verbrugge, Troy, MI (US); Gregory P. Meisner, Ann Arbor, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 13/048,716

(22) Filed: Mar. 15, 2011

(65) Prior Publication Data

US 2011/0166811 A1    Jul. 7, 2011

Related U.S. Application Data

(62) Division of application No. 11/947,466, filed on Nov. 29, 2007, now Pat. No. 7,928,690.

(51) Int. Cl.
*H02J 7/00* (2006.01)

(52) U.S. Cl. ........ 320/108; 320/104; 320/107; 320/134; 320/136

(58) Field of Classification Search .................. 320/134, 320/132, 107, 135, 136, 108, 124, 137, 149, 320/104; 324/426, 427, 428
See application file for complete search history.

(56) References Cited

U.S. PATENT DOCUMENTS

| | | | |
|---|---|---|---|
| 5,093,624 A | 3/1992 | Stevenson | |
| 5,132,626 A | 7/1992 | Limuti et al. | |
| 5,250,903 A | 10/1993 | Limuti et al. | |
| 5,537,042 A | 7/1996 | Beutler et al. | |
| 5,726,553 A * | 3/1998 | Waugh | 320/104 |
| 6,114,775 A * | 9/2000 | Chung et al. | 307/10.1 |
| 6,333,620 B1 | 12/2001 | Schmitz et al. | |
| 7,445,696 B2 | 11/2008 | You et al. | |
| 7,489,108 B2 * | 2/2009 | Matsumoto et al. | 320/132 |
| 7,557,585 B2 * | 7/2009 | Yudahira | 324/433 |
| 2004/0026142 A1 * | 2/2004 | Schmitz et al. | 180/65.3 |
| 2004/0174141 A1 * | 9/2004 | Luz et al. | 320/132 |
| 2006/0012341 A1 * | 1/2006 | Burns | 320/132 |
| 2006/0076929 A1 * | 4/2006 | Tatsumi et al. | 320/132 |
| 2006/0132141 A1 * | 6/2006 | Dougherty et al. | 324/435 |
| 2008/0066978 A1 | 3/2008 | Sugai et al. | |
| 2008/0077311 A1 * | 3/2008 | Gauthier et al. | 701/117 |
| 2008/0186000 A1 | 8/2008 | Kimura et al. | |
| 2009/0250280 A1 * | 10/2009 | Abe et al. | 180/65.285 |
| 2010/0079145 A1 * | 4/2010 | Meisner et al. | 324/432 |

OTHER PUBLICATIONS

U.S. Office Action for U.S. Appl. No. 11/947,466, mailed May 14, 2010.

* cited by examiner

*Primary Examiner* — Melissa Koval
*Assistant Examiner* — Alexis Boateng
(74) *Attorney, Agent, or Firm* — Ingrassia Fisher & Lorenz P.C.

(57) ABSTRACT

Methods and systems are provided for determining a state of charge of a battery. The battery is subjected to a predetermined magnetic field such that the battery and the predetermined magnetic field jointly create a resultant magnetic field. The resultant magnetic field is sensed. The state of charge of the battery is determined based on the resultant magnetic field.

8 Claims, 5 Drawing Sheets

METHOD AND SYSTEM FOR DETERMINING A STATE OF CHARGE OF A BATTERY

PRIORITY

This application is a divisional application of U.S. patent application Ser. No. 11/947,466, filed Nov. 29, 2007 now U.S. Pat. No. 7,928,690.

TECHNICAL FIELD

The technical field generally relates to electrochemical power sources, such as batteries, and more particularly relates to a method and system for determining the state of charge of a battery.

BACKGROUND

In recent years, advances in technology, as well as ever-evolving tastes in style, have led to substantial changes in the design of automobiles. One of the changes involves the complexity, as well as the power usage, of the various electrical systems within automobiles, particularly alternative fuel vehicles, such as hybrid, electric, and fuel cell vehicles.

Such vehicles often use electrochemical power sources, such as batteries, ultracapacitors, and fuel cells, to power the electric motors that drive the wheels, sometimes in addition to another power source, such as an internal combustion engine. An important parameter in the operation of vehicles that utilize batteries is the "state of charge" (SOC). The state of charge refers to the stored energy in the battery that is available to be used at any given time relative to the stored energy that is available when the battery is fully charged. An accurate determination of the state of charge allows for the vehicles to maximize performance and efficiency while minimizing emissions.

A conventional approach for batteries is to relate either a measured or calculated open circuit voltage to the state of charge. This is feasible because the open circuit voltage, which is the resting voltage of the battery when no load is applied, generally exhibits some observable dependence on the battery's state of charge. There are batteries, however, such as nickel metal hydride and some types of lithium ion batteries, which possess a nearly constant open circuit voltage across most of the range of state of charge. In other words, the open circuit voltage reveals nothing about the state of charge of the battery. Therefore, while these batteries are highly desirable as power sources for electric and hybrid vehicles because of their low mass, high power capability, and large energy storage capacity, they present a problem with regard to control because it is very difficult to estimate their state of charge with any degree of certainty.

Accordingly, it is desirable to provide a method and a system for determining the state of charge of a battery that is not based on its open circuit voltage. Furthermore, other desirable features and characteristics of the present invention will become apparent from the subsequent detailed description and the appended claims, taken in conjunction with the accompanying drawings and the foregoing technical field and background.

SUMMARY

A method for determining a state of charge of a battery is provided. The battery is subjected to a predetermined magnetic field such that the battery and the predetermined magnetic field jointly create a resultant magnetic field. The resultant magnetic field is sensed. The state of charge of the battery is determined based on the resultant magnetic field.

A method for determining a state of charge of an automotive battery is provided. A predetermined magnetic field is generated. The battery is subjected to the predetermined magnetic field such that the battery and the predetermined magnetic field jointly create a resultant magnetic field. A magnetically responsive component is subjected to the resultant magnetic field. An electromagnetic response within the magnetically responsive component is detected. The state of charge of the battery is determined based on the electromagnetic response.

An automotive drive system is provided. The automotive drive system includes an electric motor, a battery coupled to the electric motor, a magnetic field generator, a magnetically responsive component, and a processor in operable communication with the magnetically responsive component. The magnetic field generator is configured to subject the battery to a predetermined magnetic field such that the battery and the magnetic field generator jointly create a resultant magnetic field. The magnetically responsive component is arranged and configured to generate an electromagnetic response to the resultant magnetic field. The processor is configured to detect the electromagnetic response and determine the state of charge of the battery based on the electromagnetic response.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-8 are merely illustrative and may not be drawn to scale.

FIG. 1 to FIG. 8 illustrate a method and system for determining a state of charge of a battery. The battery is subjected to a predetermined magnetic field such that the battery and the predetermined magnetic field jointly create a resultant magnetic field. The resultant magnetic field is sensed. The state of charge of the battery is determined based on the resultant magnetic field.

The sensing of the resultant magnetic field may include subjecting a magnetically responsive component (e.g., a conductive wire or a piece metal or semiconductor material) to the resultant magnetic field and detecting an electromagnetic response (e.g., current, voltage, or power) within the magnetically responsive component.

Figure 1:
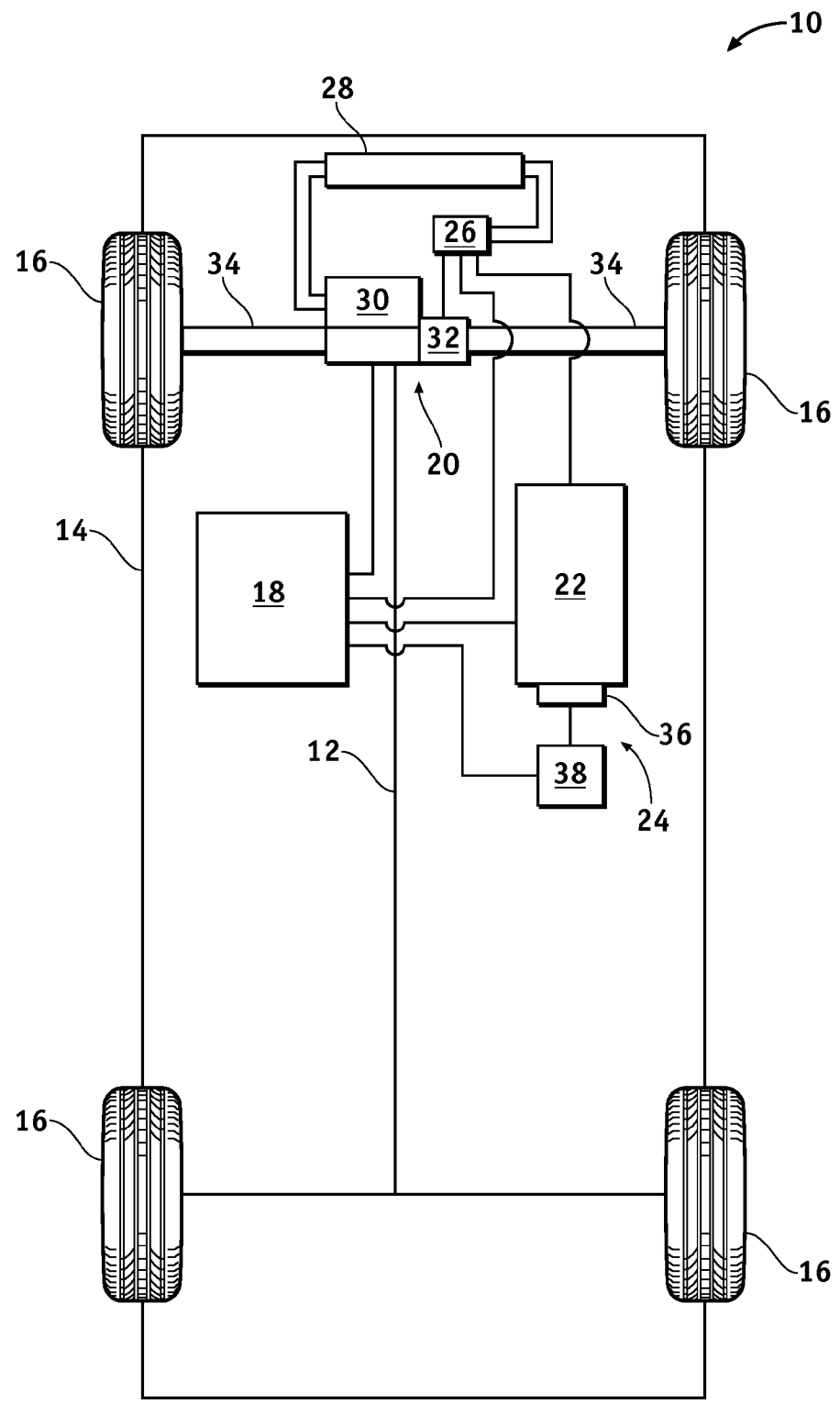
FIG. 1 is a schematic view of an exemplary automobile according to one embodiment of the present invention.

FIG. 1 illustrates a vehicle, or automobile, 10 according to one embodiment of the present invention. The automobile 10 includes a chassis 12, a body 14, four wheels 16, and an electronic control system (or electronic control unit (ECU)) 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The automobile 10 may also incorporate any one of, or combination of, a number of different types of engines (or actuators), such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, or a fuel cell, a combustion/electric motor hybrid engine, and an electric motor.

In the exemplary embodiment illustrated in FIG. 1, the automobile 10 is a hybrid vehicle (or hybrid electric vehicle (HEV)), and further includes an actuator assembly (or powertrain) 20, a battery 22, a battery state of charge (SOC) determination system 24 (or "SOC system 24"), a power inverter (or inverter) 26, and a radiator 28. The actuator assembly 20 includes an internal combustion engine 30 and an electric motor/generator (or motor) system (or assembly) 32. The battery 22 is electrically connected to the inverter 26 and, in one embodiment, is a lithium ion (Li-ion) battery including a plurality of cells, as is commonly understood.

Although not illustrated, the power inverter 26 may include a plurality of switches, or transistors, as is commonly understood. The electric motor system 32, in one embodiment, includes one or more sinusoidally-wound, three-phase alternating current (AC) motor/generators (or motors) (e.g., permanent magnet) such as commonly used in automotive vehicles (e.g., traction drive control systems and the like). As will be appreciated by one skilled in the art, each of the electric motors includes a stator assembly (including conductive coils), a rotor assembly (including a ferromagnetic core), and a cooling fluid (i.e., coolant). The stator assembly and/or the rotor assembly within the electric motors may include multiple (e.g., sixteen) electromagnetic poles, as is commonly understood.

Still referring to FIG. 1, and as described in greater detail below, the combustion engine 30 and the electric motor system 32 are integrated such that one or both are mechanically coupled to at least some of the wheels 16 through one or more drive shafts 34. In one embodiment, the automobile 10 is a "series HEV," in which the combustion engine 30 is not directly coupled to the transmission, but coupled to a generator (not shown), which is used to power the electric motor system 32. In another embodiment, the automobile 10 is a "parallel HEV," in which the combustion engine 30 is directly coupled to the transmission by, for example, having the rotor of the electric motor system 32 rotationally coupled to the drive shaft of the combustion engine 30.

The radiator 28 is connected to the frame at an outer portion thereof and although not illustrated in detail, includes multiple cooling channels throughout that contain a cooling fluid (i.e., coolant) such as water and/or ethylene glycol (i.e., "antifreeze) and is coupled to the combustion engine 30 and the inverter 26. The inverter 26 receives and shares coolant with the electric motor system 32. The radiator 28 may be similarly connected to the inverter 26 and/or the electric motor system 32.

The SOC system 24 includes a magnetic sensor 36 and a SOC module 38. The magnetic sensor 36 is located adjacent (or connected to) the battery 22 (or more particularly one cell of the battery 22). The SOC module 38 is in operable communication with the magnetic sensor 36 and in one embodiment includes at least one processor and/or a memory that includes data relating a magnetic property of the battery 22 to the state of charge of the battery 22, as is described in greater detail below. Although not illustrated as such, the SOC module 38 may be integral with the electronic control system 18 and may also include one or more power sources.

Figure 2:
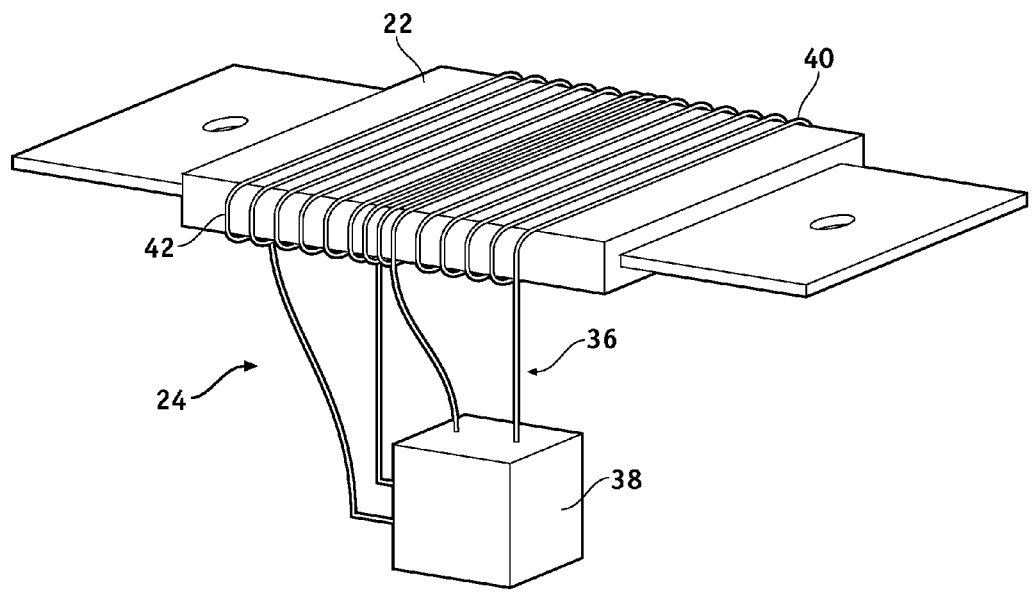
FIG. 2 is an isometric view of a state of charge (SOC) determination system within the automobile of FIG. 1 according to one embodiment of the present invention.
Figure 3:
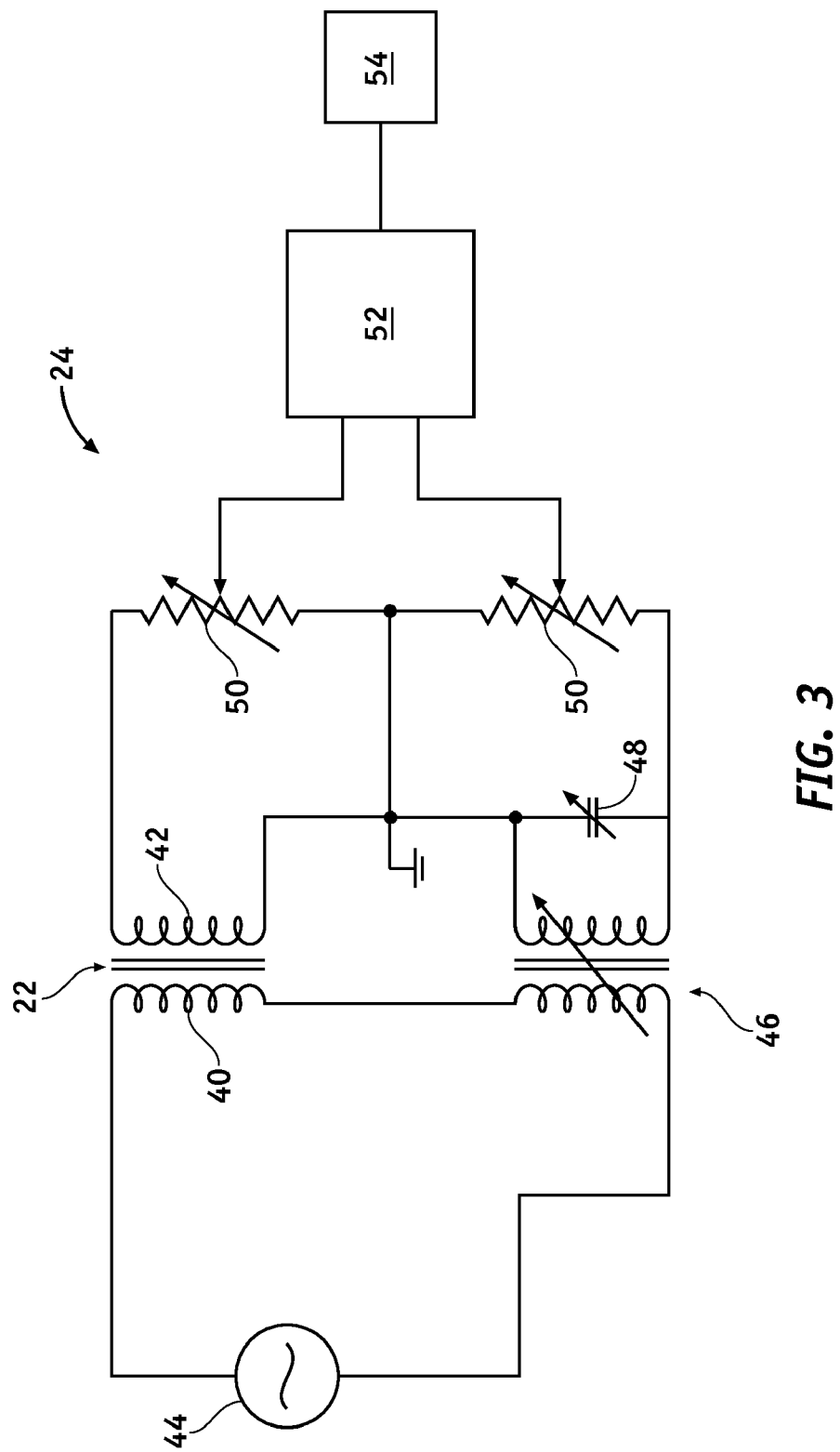
FIG. 3 is a schematic circuit diagram of the SOC determination system of FIG. 2.

FIGS. 2 and 3 illustrate the SOC system 24, according to one embodiment of the present invention, in greater detail. In the embodiment shown in FIG. 2, the magnetic sensor 36 includes a first (or primary) conductive winding (or coil) 40 and a second (or secondary) conductive winding 42. The first and second conductive windings 40 and 42 are made of electrically conductive wire, such as copper wire, and are wrapped around respective first and second portions of the battery 22. The first and second portions of the battery 22 may overlap, and as such, the first and second conductive windings 40 and 42 overlap or are intertwined. As shown schematically in FIG. 3, within the SOC module 38 (not shown), the SOC system 24 also includes a current source 44, a variable inductor 46, a variable capacitor 48, variable resistors 50, a differential amplifier 52, and a phase sensitive detector amplifier 54.

Referring again to FIG. 1, the electronic control system 18 is in operable communication with the actuator assembly 20, the battery 22, the SOC system 24, and the inverter 26. Although not shown in detail, the electronic control system 18 includes various sensors and automotive control modules, or electronic control units (ECUs), such as a body control module (BCM) 19, and at least one processor and/or a memory which includes instructions stored thereon (or in another computer-readable medium) for carrying out the processes and methods as described below.

During operation, still referring to FIG. 1, the automobile 10 is operated by providing power to the wheels 16 with the combustion engine 30 and the electric motor system 32 in an alternating manner and/or with the combustion engine 30 and the electric motor system 32 simultaneously. In order to power the electric motor system 32, DC power is provided from the battery 22 to the inverter 26, which converts the DC power to AC power, prior to energizing the electric motor system 32.

As will be appreciated by one skilled in the art, at various stages of operation, it is beneficial to have an accurate estimate of the state of charge of the battery 22, particularly in an embodiment using a lithium ion battery. According to one embodiment of the present invention, the magnetic sensor 36 detects, or senses, a magnetic property of the battery 22. The SOC module 38 (and/or the electronic control system 18) then determines the state of charge of the battery 22 based, at least in part, on the magnetic property. In one embodiment, the magnetic property is magnetic susceptibility which is determined by detecting an electromagnetic response within the second conductive winding 42. The electromagnetic response is caused by a magnetic field generated by flowing current through the first conductive winding 40 in combination with a magnetic field generated by the battery 22 in response to the magnetic field generated by the first conductive winding 40.

Magnetic susceptibility describes the extent to which a material becomes magnetized in the presence of an applied magnetic field. The magnetic susceptibility per unit volume of the material, $\chi_v$, is given by the equation $$\chi_v = \frac{M}{H}, \tag{1}$$

where M is the magnetization expressed as the magnetic dipole per unit volume, and H is the applied magnetic field. Susceptibility may also be expressed per unit mass or per mole of the material. The mechanical force exerted by the applied magnetic field on the material is proportional to the susceptibility $\chi$, to the magnetic field strength, and to the magnetic field gradient. If $\chi$ is positive, the material is attracted to regions of increasing magnetic field strength and is described as being "paramagnetic." If $\chi$ is negative, the material is conversely repelled and is described as being "diamagnetic."

The magnetization induced in the material by the action of the applied magnetic field generates its own magnetic field that combines with the applied field. In the case of a paramagnetic material, the combined magnetic field is in general increased over the applied magnetic field alone, where that increase is proportional to the paramagnetic susceptibility of the material. In the case of a diamagnetic material, the resulting combined magnetic field is, conversely, reduced. Both cases can, in principle, be used for the purposes of this invention, but because paramagnetism is a much stronger phenomenon than diamagnetism, in general, the former is preferred.

Apart from magnetism generated by free circulating electrical currents, as in, e.g., electromagnets, magnetism in materials generally arises from both the localized spin of electrons and their orbital motion within atoms. Magnetic susceptibility is observed in free ions of the iron-group series, actinide-series, and rare-earth series elements on the periodic table. Compounds incorporating these elements also exhibit susceptibility, and some of these compounds find use as active materials for electrochemical energy storage in batteries. They often belong to a class known as intercalation compounds, which are characterized by the ability to have small ions (such as Li) readily inserted into and withdrawn from their solid-state structures. This behavior provides for the charge and discharge processes of the batteries.

Common metal oxides for lithium ion batteries that are intercalation materials include lithium cobalt oxide ($LiCoO_2$), lithium nickel oxide ($LiNiO_2$), and variants of the form $LiCo_xNi_yMn_zO_2$, where the cobalt, nickel, and manganese species occupy the same lattice and x+y+z=1. On the other hand, some materials form two phases and are referred to as simply insertion electrodes, a more general term that also comprises intercalation materials. An example of a two-phase insertion electrode presently being considered for use as a cathode in lithium ion batteries is iron phosphate ($FePO_4$). The relevant electrochemical reaction is

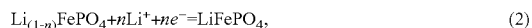
$$Li_{(1-n)}FePO_4 + nLi^+ + ne^- = LiFePO_4, \tag{2}$$

where n is the number of lithium ions and electrons involved in the reaction. During discharge of the battery, lithium is inserted into the iron phosphate, and while the battery is being charged, lithium is removed. The fraction of lithium in the material relative to the maximum amount of lithium the material can except (i.e., one Li in $LiFePO_4$) corresponds to the fractional state of charge, which when multiplied by 100 yields the state of charge.

When the free atoms, iron (Fe), phosphorous (P), and oxygen (O), in iron phosphate join, the individual electronic structures are modified to become part of the larger compound. The valence electrons of each atom contribute to bonding within the compound and charge transfer occurs among the atoms. The new electronic structure that is formed is characteristic of the specific compound and has a unique magnetic susceptibility associated with it. Further modification of the electronic structure occurs when more ions are introduced to the compound, as would be the case with insertion of lithium into the iron phosphate electrode during discharge of a lithium ion battery. This change has a measurable effect on the susceptibility of the electrode in proportion to the amount lithium added. By systematically varying the fraction of lithium in the electrode and measuring the corresponding susceptibility, $\chi$, it is possible to establish a relationship between the two variables. Embodiments of the present invention utilize changes in the magnetic susceptibility of the electrode to determine the state of charge of the battery.

The SOC module 38 conducts current through the first conductive winding 40 to generate a predetermined magnetic field. As will be appreciated by one skilled in the art, changes in the magnetic field cause an electromagnetic response within the second conductive winding 42, such as a voltage, current flow, and/or electric power. At the same time, the predetermined magnetic field causes the battery 22 to become magnetized, and thus generate a complimentary magnetic field, based on its state of charge, which interacts with the predetermined state of charge and similarly causes an electromagnetic response (e.g., current, voltage, and/or power) in the second conductive winding 42. Stated differently, the predetermined magnetic field and the complimentary magnetic field interact to jointly form a resultant (or total) magnetic field which causes an electromagnetic response within the second conductive winding 42 based on the state of charge of the battery 22.

Thus, prior to operation, the battery 22 may be connected to a "cycler" (or charger) and the state of charge of the battery 22 may be set to desired values while the electromagnetic response within the second conductive winding 42 is monitored. The information gathered is used to generate a look-up table, a graph, and/or a function of the strength of the electromagnetic response within the second conductive winding 42 vs. state of charge of the battery 22, which is stored in the SOC module 38. The data in the look-up table may be taken from laboratory experiments performed on representative batteries across the range of expected operating temperatures. Algorithms for controlling the hardware, deciding when to make measurements, and processing the signal from the hardware may also be stored in the SOC module 38.

During normal operation, referring to FIGS. 2 and 3, as the state of charge of the battery 22 changes, the electromagnetic response within the second conductive winding 42 varies. The electromagnetic response is detected by the SOC module 38, which compares it to the states of charges within the look-up table to determine the present state of charge of the battery. In at least one embodiment, the state of charge is determined without using the voltage of the battery 22.

Referring specifically to FIG. 3, the variable inductor 46 may be adjusted to give a signal that balances that of the second conductive winding 42, and the variable resistors 50 allow for fine tuning of the signal into the differential amplifier pre-amplifier 52 of the phase sensitive detector (lock-in) amplifier 54. The variable capacitor 48 across the variable inductor 46 serves to adjust the phase shift of the signal within the first conductive winding 40 relative to that within the second conductive winding 42 for optimal balancing of the two signal inputs to the differential amplifier 52.

Figure 4:
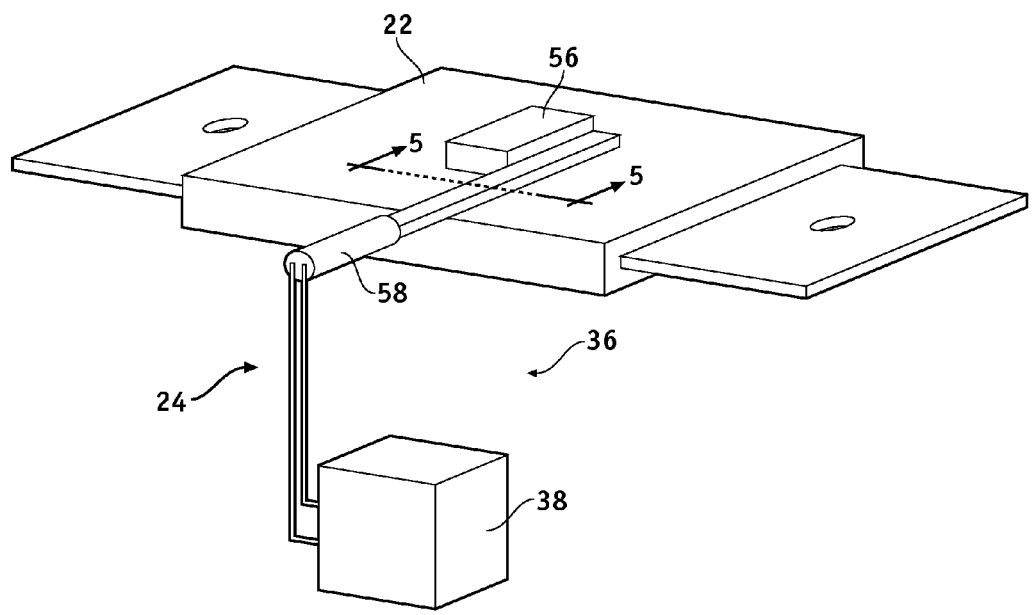
FIG. 4 is an isometric view of a SOC determination system according to another embodiment of the present invention.
Figure 5:
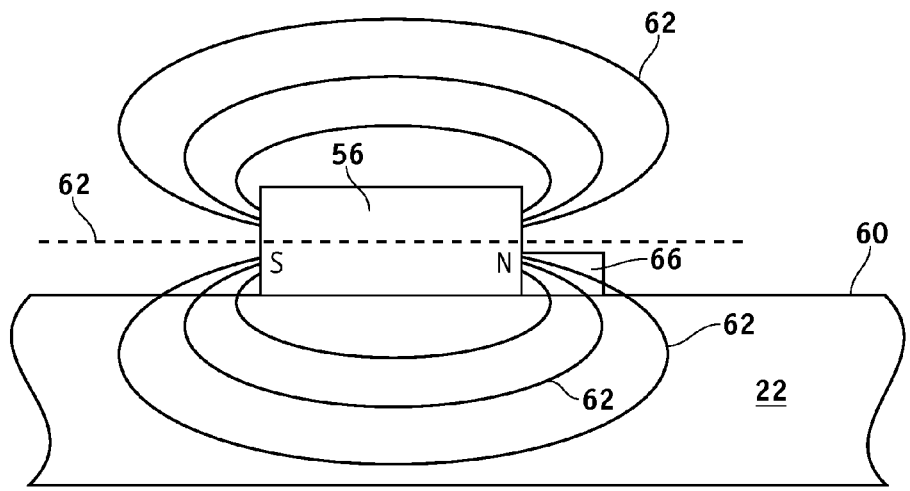
FIG. 5 is a cross-sectional side view of the SOC determination system of FIG. 4 taken along line 5-5.
Figure 6:
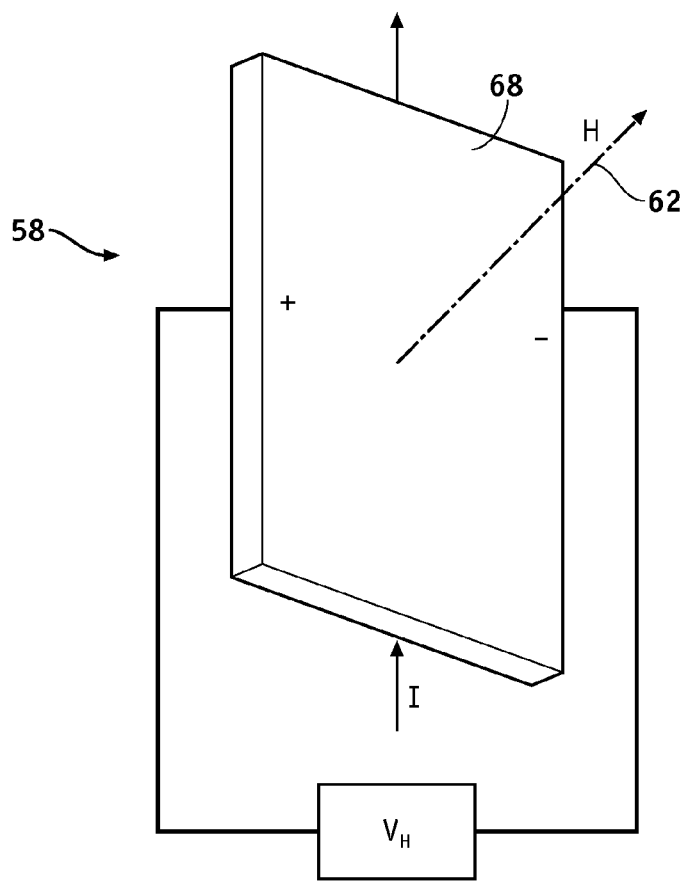
FIG. 6 is a schematic view of a Hall Effect sensor within the SOC determination system of FIG. 4.

FIGS. 4, 5, and 6 illustrate the SOC system 24 according to another embodiment of the present invention in which the magnetic sensor 36 includes a permanent magnet 56 and a Hall Effect probe (or sensor) 58. As shown in FIG. 5, the permanent magnet 56 is positioned adjacent to a side 60 of the battery 60 such that a dashed line 62 extending through the poles (N and S) thereof is parallel to the side 60. As a result, magnetic flux lines 62 extending from the magnet 56 extend into the battery 22 in a direction that is substantially perpendicular to the side 60 of the battery 22.

Still referring to FIGS. 4 and 5, the Hall Effect probe 58 includes a probe end 66 that is positioned on the side 60 of the battery 22 adjacent to the magnet 56. As shown schematically in FIG. 6, the Hall Effect probe 58 includes a magnetically responsive component 68, such as a conductor or semiconductor, through which current (I) is conducted by a current source (not shown) and oriented relative to the magnet 56 such that the flux lines 62 extend therethrough as shown. As will be appreciated by one skilled in the art, when a magnetic flux (e.g., flux lines 62) passes through the component 68 substantially perpendicularly, the electrons flowing through the component 68 are forced to one side of the component 68, thus creating an electromagnetic response voltage within the component 68 (i.e., a Hall Voltage ($V_H$) across the sides of the component transverse to the flow of current).

A predetermined magnetic field generated by the permanent magnet 56 causes the battery 22 to become magnetized, and thus generate a complimentary magnetic field, based on its state of charge, which interacts with the predetermined state of charge and similarly causes an electromagnetic response in the magnetically responsive component 68 within the Hall Effect probe 58. Stated differently, the predetermined magnetic field and the complimentary magnetic field interact to jointly form a resultant (or total) magnetic field which causes an electromagnetic response within the component 68 based on the state of charge of the battery 22.

As the magnetic field of the battery 22 changes with its state of charge, the voltage detected across the component 68 changes as the amount of magnetic flux passing perpendicularly therethrough is altered. In a manner similar to that described above, a look-up table may be generated that compares detected Hall voltages to known states of charge of the battery 22. The look-up table is stored within the SOC module 38 and used to determine the state of charge of the battery 22 using the voltage detected within the Hall Effect probe 58 during normal operation of the automobile 10.

The state of charge may be measured continuously throughout operation, or if electromagnetic interference makes this impractical, it may be measured at times when there is little or no current flowing in the battery 22. For hybrid (or electric) vehicle batteries, it may be preferable to take measurements while the automobile 10 is off, or just after the ignition is activated.

In one embodiment, whenever current is within acceptable limits and a valid susceptibility measurement becomes available, the corresponding state of charge (or a magnetic portion of the state of charge), $SOC_\chi$, is retrieved from the look-up table and is blended as a correction signal with a current associated with the battery, such as an amp-hour-based state of charge (or a current portion of the state of charge), $SOC_{Ah}$, which may correspond in an integration of the current flow through the battery 22. The blending is performed in a manner such that the weighting of the susceptibility-based state of charge ($SOC_\chi$) is greatest at the point at which the measurement occurs, then diminishes as a function of the amp-hour throughput ($\Delta Ah$) that the battery experiences. This can achieved through the use of a variable weight factor, w, in the blending equation $$SOC = w SOC_\chi + (1-w) SOC_{Ah}, \quad (3)$$

where w is a function of $\Delta Ah$. The amp-hour-based state of charge is calculated continuously whenever current is flowing through the battery 22 in either the SOC module 38, or another, remote microprocessor which transmits the value over a vehicle communication bus. While a linear combination is proposed in Eq. 3, other combinations (e.g., a geometric mean, or $SOC = SOC = \sqrt{SOC_\chi SOC_{Ah}}$) may also be employed).

The amp-hour-based state of charge is calculated according to the equation $$SOC_{Ah} = SOC_{t-\Delta t} + \frac{I \Delta t}{Ah_{nominal}} \times 100, \quad (4)$$

where I is current, $\Delta t$ is the time interval of the calculation, and $Ah_{nominal}$ is the rated capacity of the battery. Note that the incremental change in $SOC_{Ah}$, $$\frac{I \Delta t}{Ah_{nominal}} \times 100,$$

is added to the blended SOC from the previous time step, $SOC_{t-\Delta t}$. In this manner, the calculation of $SOC_{Ah}$ may always incorporate any correction that has been provided by $SOC_\chi$. By allowing the influence of $SOC_\chi$ to decay by means of the weight factor w, the reported state of charge is not unduly biased by data that is too old to be applicable. Other methods of calculating state of charge based on current (and/or voltage) are known in the art, such as those described in U.S. Pat. No. 6,639,385, and may be utilized in other embodiments of the present invention in combination with the methods described herein.

Figure 7:
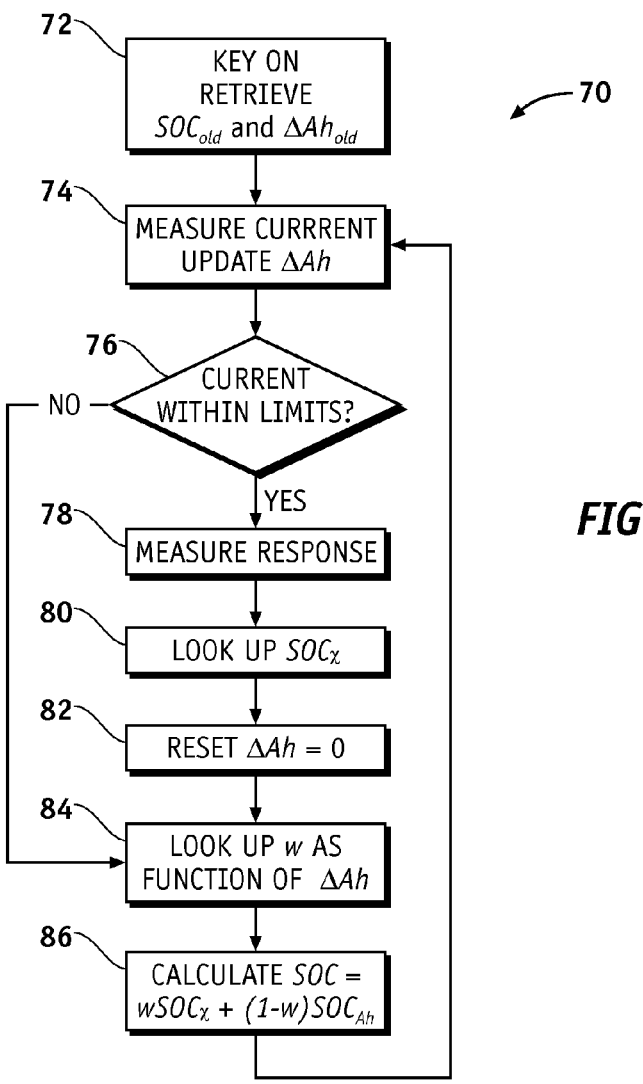
FIG. 7 is a flow chart of a method for determining a state of charge of a battery according to one embodiment of the present invention.

FIG. 7 illustrates a method 70 for determining a state of charge, according to one embodiment of the present invention. The series of steps 72-86 may occur continuously at intervals of one second or less whenever the automobile 10 is turned on.

The method 70 begins at step 72 when the vehicle key is turned on (e.g., when the ignition is activated), and values of state of charge ($SOC_{old}$) and amp-hour throughput ($\Delta Ah_{old}$) that were stored when the vehicle last powered down are retrieved from non-volatile memory. At step 74, current is measured and the amount of energy that has passed through the battery since the magnetic susceptibility ($\chi$) was last determined ($\Delta Ah$) is updated. At step 76, a test is performed to determine whether the current flow through the battery pack is low enough (i.e., within a preset limit stored in the SOC module 38) such that it will not interfere with the magnetic sensor 36. If this condition is met, the electromagnetic response of the magnetically responsive component (e.g., the second conductive winding 42 or the component 68) is measured at step 78 and converted to a susceptibility-based state of charge ($SOC_\chi$) by means of the look-up table stored in the SOC module 38 (FIG. 2) at step 80. Then, at step 82, $\Delta Ah$ is reset to zero.

Figure 8:
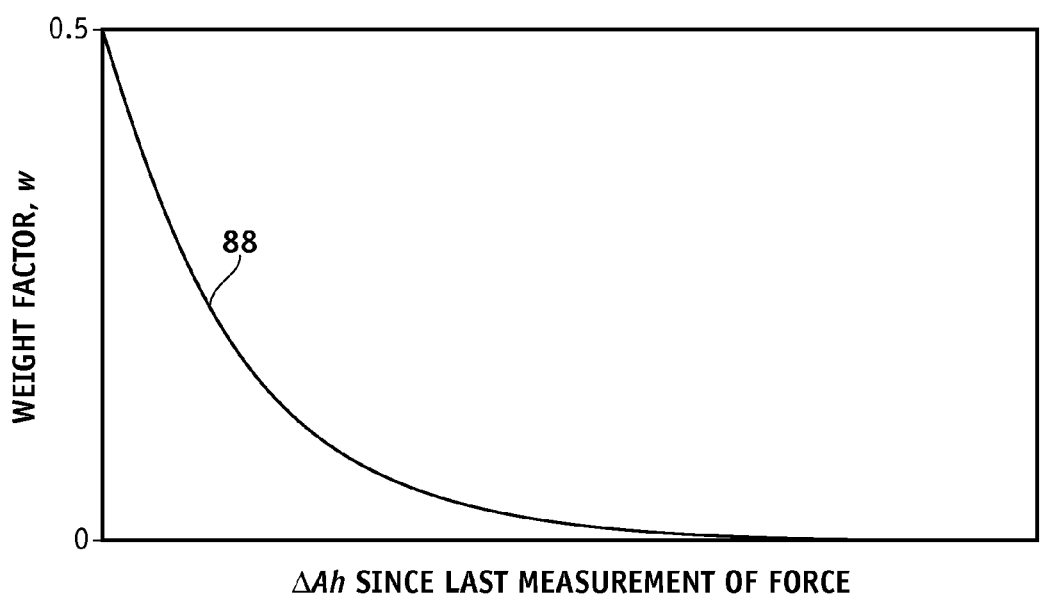
FIG. 8 is a graph comparing a weight factor to a current flow through a battery used in the method of FIG. 7.

At step 84, the weight factor (w) for the contribution of $SOC_\chi$ to the blended state of charge is taken from a look-up table which describes a relationship between w and $\Delta Ah$. An example of such a table is shown in FIG. 8. Note that if $\Delta Ah$ has just been reset to zero, w will take on its maximum value as indicated by the exponential decay of w as shown by line 88. At step 86, the blended state of charge is calculated using the weight factor determined in step 84 (e.g., 0.5). The method 70 then loops back to step 74 and is repeated.

At step 76, if the current is not within the preset limits, the method 70 bypasses steps 78, 80, and 82 and proceeds with step 84. For each successive loop through the process for which the current condition fails to be met, the value of $\Delta Ah$ will increment due to the operation of the automobile 10, and the corresponding value of w retrieved from the look-up table decreases according to FIG. 8. In this manner, the influence of $SOC_\chi$ on state of charge is prominent whenever the current condition is met, and fades during periods when the current condition is not met.

One advantage of the method and system described above is that because the state of charge of the battery is determined without using the voltage of the battery, the use of batteries with relatively invariant open circuit voltage, such as some lithium ion batteries, is facilitated. Another advantage is that because of the weighting scheme described above, the magnetic state of charge is always supplemented by the current-based state of charge. Thus, the accuracy of the state of charge calculation is improved.

Other embodiments may be directed towards sensing or detecting magnetic properties of the battery other than magnetic susceptibility, such as magnetization, magnetic moments, and magnetic permeability with any type of sensor capable of sensing the property. The method and system may be used in vehicles other than automobiles, including aircraft and watercraft, as well as other types of electrical systems utilizing electrochemical power sources, such as computing systems. An electromagnet or any device capable of generating field that stimulates a magnetic response in the battery may be used instead of the permanent magnet shown. Other methods for combining the magnetic portion and the current portion of the state of charge may be used. It is also possible for voltage-based methods to be combined with the magnetic-based state of charge. It should also be noted that the battery may include multiple cells, each of which may be monitored with a separate magnetic sensor as described above. The resultant state of charge may then be extracted though a combination of the measurements taken by the multiple magnetic sensors.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An apparatus comprising:
   a battery;
   a magnetic sensor is one of located adjacent to and attached to the battery; and
   a state of charge module in operable communication with the magnetic sensor, the state of charge module being configured to:
   subject the battery to a predetermined magnetic field such that the battery and the state of charge module jointly create a resultant magnetic field; and
   to detect an electromagnetic response to the predetermined magnetic field.

2. The apparatus of claim 1, wherein the predetermined magnetic field is applied by a permanent magnet.

3. The apparatus of claim 1, wherein the state of charge module comprises:
   an output amplifier;
   a first conductive winding configured to induce the predetermined magnetic field in the battery by conducting a first current flow;
   a second conductive winding configured to conduct a second current flow induced in the second conductive winding by the resultant magnetic field; and
   a control circuit configured to adjust the first current flow and the second current flow to produce a balanced input to the output amplifier.

4. The apparatus of claim 3, wherein the first conductive winding and the second conductive winding are wound around the battery.

5. The apparatus of claim 3, wherein the first conductive winding at least partially overlaps the second conductive winding.

6. The apparatus of claim 3, wherein the control circuit comprises a variable inductor connected in series with the first conductive winding and the second conductive winding.

7. The apparatus of claim 6, wherein the control circuit comprises a variable resistor connected in parallel with the second conductive winding and the variable inductor.

8. The apparatus of claim 7, wherein the output amplifier receives an input from the variable resistors.

* * * * *